United States Patent [19]

Kwan

[11] Patent Number: 4,990,864
[45] Date of Patent: Feb. 5, 1991

[54] CURRENT AMPLIFIER CIRCUIT

[75] Inventor: Stephen C. Kwan, Plano, Tex.

[73] Assignee: Texas Instruments Incorporated, Dallas, Tex.

[21] Appl. No.: 477,140

[22] Filed: Feb. 7, 1990

[51] Int. Cl.$^5$ ............................................. H03F 3/04
[52] U.S. Cl. .................................. 330/288; 330/289; 323/315
[58] Field of Search .................. 330/256, 289, 288; 323/315, 316

[56] References Cited

U.S. PATENT DOCUMENTS

| | | | |
|---|---|---|---|
| 4,055,811 | 10/1977 | Wheatley, Jr. | 330/256 X |
| 4,614,916 | 9/1986 | Rinderle | 330/289 |
| 4,677,368 | 6/1987 | Bynum | 330/256 X |
| 4,814,724 | 3/1989 | Tanigawa | 330/288 |

FOREIGN PATENT DOCUMENTS

| | | | |
|---|---|---|---|
| 0000750 | 1/1979 | Japan | 323/315 |
| 1332516 | 8/1987 | U.S.S.R. | 330/256 |

OTHER PUBLICATIONS

Radovsky, "Current-Mirror Amplifiers Having Current Gains Less Influenced by the Base Currents of Component Transistors," *RCA Technical Notes*, TN No. 949, Dec. 1973.

Primary Examiner—James B. Mullins
Attorney, Agent, or Firm—B. Peter Barndt; Melvin Sharp; James T. Comfort

[57] ABSTRACT

An amplifier circuit (10) is provided which comprises a first transistor (12) and a second transistor (14). A current buffer circuit (16) is coupled to the basis of the transistors (12, 14) to provide base drive current. A voltage proportional to absolute temperature, $V_{PTAT}$, is applied between the emitters of the transistors (12,14). An input current is received by the transistor (12) and an output current is generated by the transistor (14). The output current $I_{out}$ is amplified with respect to the input current $I_{in}$ by a gain factor which is substantially independent of temperature considerations. Circuitry is provided for altering the value of the voltage proportional to the absolute temperature, $V_{PTAT}$, such that the gain of the amplifier circuit (10) is programmable.

23 Claims, 2 Drawing Sheets

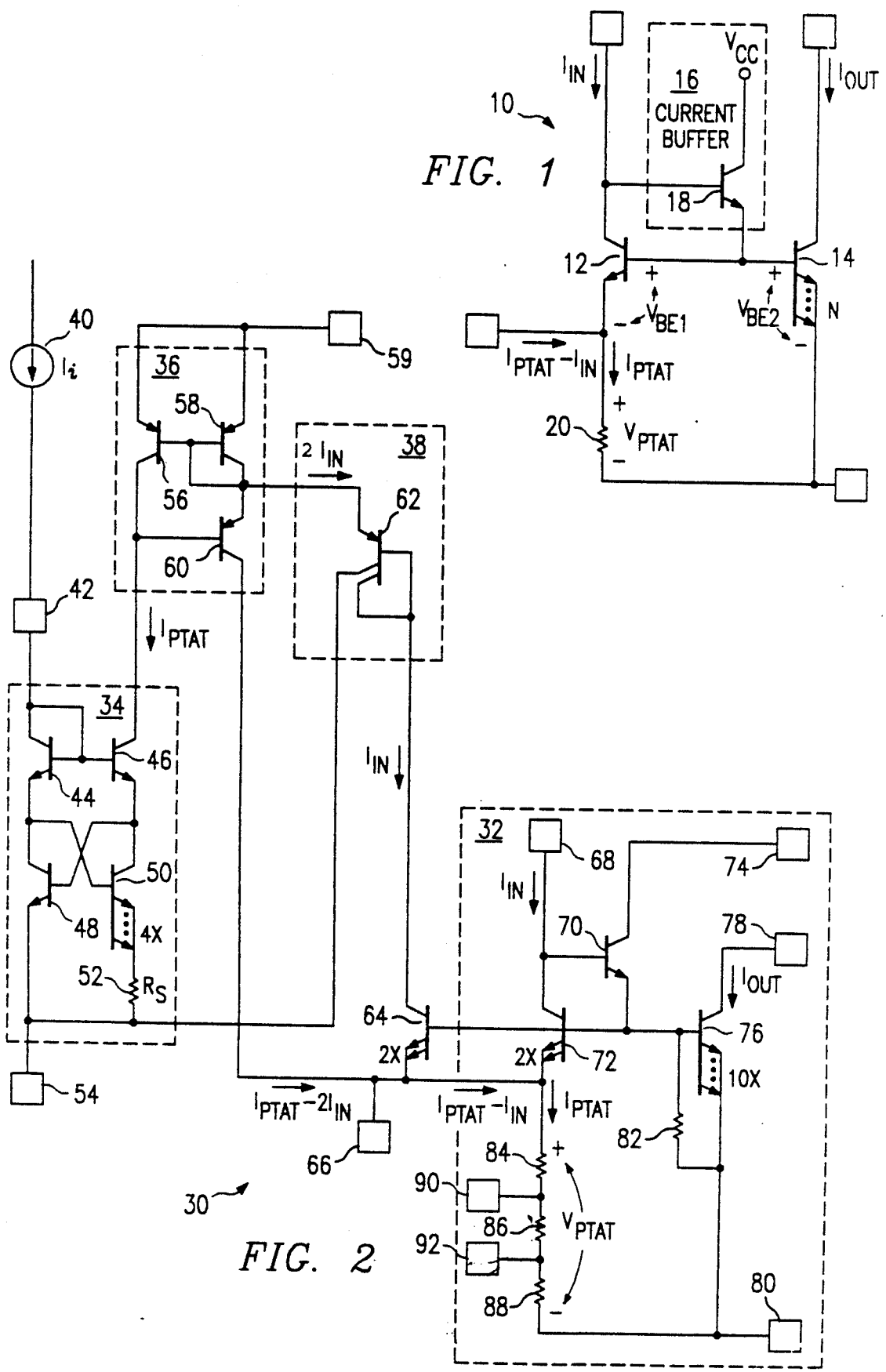

CURRENT AMPLIFIER CIRCUIT

This application is a continuation of application Ser. No. 331,936, filed Mar. 31, 1989, now abandoned.

TECHNICAL FIELD OF THE INVENTION

This invention relates in general to the field of integrated electronic devices. More particularly, the present invention relates to a method and apparatus for providing substantially constant gain in a current amplifier circuit with respect to ambient temperature variations.

BACKGROUND OF THE INVENTION

Most integrated electronic devices exhibit changes in their performance characteristics as the temperature of the environment in which they are operating changes. This temperature dependence is due to the fact that most of the electronic components comprising these devices are themselves temperature dependent. In the case of an amplifier circuit, the gain of the amplifier can vary significantly because of changes in the ambient temperature. If the amplifier is a component of a larger integrated electronic device, the designer of the device must allow for these variations in performance due to temperature. This creates significant circuit design problems if an integrated device is to be used in an environment with widely varying temperatures.

Simple circuits commonly used as amplifier stages are very susceptible to temperature changes. For example, a Darlington connection of two transistors can experience 100% change in the gain of the amplification stage over the normal working temperature range of the device. More complicated circuits may include compensation for this wide temperature dependence, but sacrifice the simplicity of the Darlington pair.

Accordingly, a need has arisen for an amplifier circuit which has relatively few components, but can maintain a substantially constant gain over a wide temperature range.

SUMMARY OF THE INVENTION

In accordance with the present invention, an amplifier circuit is provided which substantially eliminates or reduces disadvantages and problems associated with prior amplifier circuits. A circuit is provided which provides a current gain which is substantially temperature independent.

More specifically, the present invention provides for the use of two transistors and a current buffer circuit used to provide base drive current to the two transistors which are coupled in a mirror configuration. A voltage proportional to absolute temperature is applied between the emitters of the transistors. Because of the transfer characteristics of the transistors in the amplifier circuit, the temperature dependent devices compensate for one another and the resultant current gain is substantially temperature independent.

According to another aspect of the present invention, a current proportional to temperature is driven through a resistive element coupled between the emitters of the transistors. The resistive element comprises a series connection of a plurality of resistors. Circuitry is provided such that selected resistors within the resistive element may be shorted out in order to alter the overall resistance of the resistive element. In this manner, the voltage between the emitters of the transistors may be programmed and thus the amplifier may be programmed to have any one of a number of predetermined current gains all of which will be substantially temperature independent.

An important technical advantage of the present invention is that it provides for a substantially constant gain with respect to temperature variations, but uses a relatively small number of components. Through the use of the teachings of the present invention, an amplifier circuit may be built which has a programmable current gain which will vary by only a few percentage points over the normal operating range of temperature for most integrated electronic devices.

BRIEF DESCRIPTION OF THE DRAWINGS

A more complete understanding of the present invention may be acquired by referring to the Detailed Description and claims when considered in connection with the accompanying drawings in which like reference numbers indicate like features, wherein:

FIG. 1 is a schematic diagram of an amplifier circuit constructed in accordance to the present invention; and FIG. 2 is a schematic diagram of one embodiment of the present invention illustrating the programmable capability of the present invention and one method of providing the current proportional to temperature used in the present invention.

FIG. 3 is a modification of FIGS. 1 and 2.

DETAILED DESCRIPTION OF THE INVENTION

FIG. 1 illustrates a schematic diagram of an amplifier circuit, indicated generally at 10, constructed according to the teaching of the present invention. Circuit 10 comprises a first transistor 12 and a second transistor 14. First transistor 12 has its base coupled to the base of second transistor 14. Transistors 12 and 14 are constructed such that they exhibit identical transfer characteristics with the exception that transistor 14 is sized to be N times larger than transistor 12 where N is any predetermined factor. This sizing may be accomplished, for example, by forming transistor 14 to have N times the number of emitters as transistor 12. Transistors 12 and 14 are shown to be npn type bipolar junction transistors. It should be understood that the teachings of the present invention are equally applicable using pnp transistors.

An input current $I_{in}$ is shown in FIG. 1 to be flowing in the collector of transistor 12. An output current $I_{out}$ is shown flowing in the collector of transistor 14. A current buffer 16 is shown coupled between the collector of transistor 12 and the bases of transistors 12 and 14. Current buffer 16 operates to provide base drive current to transistors 12 and 14. One embodiment of current buffer 16 is shown in FIG. 1 to comprise a transistor 18 with its base coupled to the collector of transistor 12 and its emitter coupled to the bases of transistors 12 and 14. The collector of transistor 18 is coupled to a $V_{CC}$ voltage supply. Transistor 18 is illustrative of only one possible method of providing the base current drive required of current buffer 16. Alternate embodiments of current buffer 16 could include a Darlington configuration of two transistors as shown in FIG. 3. It should be understood that still other embodiments of current buffer 16 are possible and these other embodiments are intended to be included within the scope of the present invention.

A current labeled ($I_{PTAT}-I_{in}$) is shown being input into circuit 10 at the emitter of transistor 12. This current when joined with the input current $I_{in}$ forms the current labelled $I_{PTAT}$ shown in FIG. 1 to be flowing through a resistor 20. The current $I_{PTAT}$ flowing through resistor 20 creates a voltage labeled $V_{PTAT}$.

The current $I_{PTAT}$ and the voltage $V_{PTAT}$ are both proportional to absolute temperature in degrees Kelvin. The current $I_{PTAT}$ is created using circuitry known in the art such that its magnitude is proportional to the junction temperature of the device. As will be discussed herein, the fact that the magnitude of the current $I_{PTAT}$ changes proportionately to the ambient temperature directly results in the amplifier circuit 10 exhibiting a substantially constant gain when subjected to even dramatic temperature changes.

The current gain of amplifier circuit 10 is defined as the ratio of output current $I_{out}$ to the input current $I_{in}$. The base to emitter voltages for transistor 12 and transistor 14 have been labelled in FIG. 1 as $V_{BE1}$ and $V_{BE2}$ respectively.

The operation of the amplifier circuit 10 may be best understood by an examination of the equations associated with its components. By summing the voltages around the lower loop of circuit 10, the following equation may be derived:

$$V_{PTAT} + V_{BE1} = V_{BE2}$$

This equation may be algebraically rearranged to give an equation for $V_{PTAT}$ in terms of the $V_{BE}$ voltages of the transistors 12 and 14 as follows:

$$V_{PTAT} = V_{BE2} - V_{BE1}$$

$V_{BE2}$ and $V_{BE1}$ may be written in terms of the input and output currents $I_{in}$ and $I_{out}$ as follows:

$$V_{BE1} = \frac{kT}{q} \ln(cI_{in}) \qquad (3)$$

$$V_{BE2} = \frac{kT}{q} \ln \frac{cI_{out}}{N} \qquad (4)$$

where k is Boltzman's constant, T is the absolute junction temperature in degrees Kelvin, q is the unit charge of an electron, N is the ratio of the size of transistor 14 to transistor 12 discussed previously, and c is a constant incorporating the transfer characteristics of transistors 12 and 14. By substituting equations (3) and (4) into equation (2), the following expression for $V_{PTAT}$ may be derived:

$$V_{PTAT} = \frac{kT}{q} \ln \frac{cI_{out}}{N} - \frac{kT}{q} \ln(cI_{in}) \qquad (5)$$

$$V_{PTAT} = \frac{kT}{q} \ln \frac{I_{out}/N}{I_{in}}$$

Assuming that $V_{PTAT}$ is $I_{PTAT}$ times the value R of the resistor 20, then an equation for $I_{out}$ may be derived as follows for equation (5):

$$I_{PTAT}R = \frac{kT}{q} \ln \frac{I_{out}/N}{I_{in}} \qquad (6)$$

$$\exp \frac{qI_{PTAT}R}{kT} = \frac{I_{out}/N}{I_{in}}$$

$$I_{out} = NI_{in} \exp \frac{qI_{PTAT}R}{kT}$$

Using a circuit which will be described in conjunction with the description of FIG. 2, the current $I_{PTAT}$ can be generated with the following characteristics:

$$I_{PTAT} = \frac{mkT}{R_s q} \ln\lambda \qquad (7)$$

where m is a scaling constant, $R_s$ is a value of a resistor used to generate $I_{PTAT}$, and $\lambda$ is a constant current density ratio. By substituting the equation (7) for $I_{PTAT}$ into equation (6), an expression for the gain of the circuit 10 may be derived as follows:

$$I_{out} = NI_{in} \exp\left(\frac{qmkTR\ln\lambda}{qR_s kT}\right) \qquad (8)$$

$$I_{out} = \lambda NI_{in} \exp \frac{mR}{R_s}$$

$$\beta = \frac{I_{out}}{I_{in}} = \lambda N \exp \frac{mR}{R_s}$$

The equation (8) derived for the gain $\beta$ of circuit 10 helps to illustrate important technical advantages of the present invention. The gain $\beta$ is dependent on the current density ratio $\lambda$, the sizing ratio N, the scaling constant m and the ratio of the resistances R to $R_s$. The resistors R and $R_s$ may be constructed in such a manner that they exhibit identical temperature dependence. Thus, any temperature dependence of resistors R and $R_s$ cancels and their ratio remains a constant term. The gain $\beta$ of circuit 10 is therefore a constant, as it does not contain any terms which are dependent on temperature.

Further, the gain $\beta$ is proportional to the exponential of the ratio of two resistor values. For example, by using a series connection of a plurality of resistors, and circuitry for shorting out selected resistors in the series connection, the value of the resistance ratio can be selectively changed. In addition, other methods of programming the magnitude of the voltage between the emitters could also be used as long as the magnitude of the voltage changes proportionately to the absolute temperature of the device. Circuit 10 is thus adaptable to become an amplifier with a programmable current gain which, at any selected value for the gain $\beta$, is substantially independent of the ambient temperature of the device.

FIG. 2 is a schematic diagram of one possible embodiment of the present invention which illustrates one method by which the current proportional to temperature $I_{PTAT}$ might be generated. Additionally, FIG. 2 illustrates one method in which the gain of the amplification stage might be programmed. An amplifier circuit indicated generally at 30 in FIG. 2 encompasses the aforementioned features.

Circuit 30 may be conveniently divided into four general circuits. An amplification circuit 32 constitutes approximately the same structure that was illustrated in FIG. 1. A current source 34 is used to generate the current proportional to absolute temperature, $I_{PTAT}$. A current mirror 36 is used to supply current to a current subtractor 38. Current subtractor 38 functions to subtract a certain amount of current from the current proportional to absolute temperature, $I_{PTAT}$, such that when the input current, $I_{in}$, and the current proportional to absolute temperature are summed within the amplifier circuit 32, the voltage generated will be solely proportional to absolute temperature with no dependence on fluctuations in the input current, $I_{in}$.

The current source 34 receives an initial current, $I_i$, through a terminal 42. The initial current $I_i$ enters the current source 34 through the collector of a transistor 44. The collector of transistor 44 is also coupled to the base of transistor 44 and to the base of a transistor 46. The emitter of transistor 44 is coupled to the base of a transistor 50, and to the collector of a transistor 48. The emitter of transistor 46 is coupled to the base of transistor 48 and to the collector of transistor 50. Transistor 50 is sized to be four times the size of transistor 46 or to have four times the emitters of transistor 46.

The emitters of transistor 50 are coupled through a resistor 52 which is labeled $R_s$ to the emitter of transistor 48 and to a terminal 54. The resistor 52 has a value $R_s$ which is the same value which appeared in equations (7) and (8) for $I_{PTAT}$ which were previously discussed. The current mirror 36 comprises a transistor 56 and a transistor 58, which have their bases coupled together. The emitter of transistor 56 are also coupled to the emitter of transistor 58 and to a terminal 59. The bases of transistor 58 and transistor 56 are coupled to the collector of transistor 58 and to the emitter of a transistor 60. The collector of transistor 56 is coupled to the base of transistor 60 and to the collector of transistor 46 in current source 34. The $I_{PTAT}$ current is generated in the collector of transistor 46 and through the operation of current mirror 36 is generated in the collector of transistor 58.

The subtractor circuit 38 comprises a transistor 62 which has its emitter coupled to the collector of transistor 58 and the emitter of transistor 60. The transistor 62 has its base coupled to one of its collectors. The remaining collector of transistor 62 is coupled to the emitter of transistor 48, to the resistor 52 and to the terminal 54. Current subtractor 38 operates to pull two times the input current $I_{in}$ from the collector of transistor 58. This results in the current flowing in the collector of transistor 60 differing from the magnitude of the current $I_{PTAT}$ by two times the input current $I_{in}$ as labeled in FIG. 2.

The base and the collector of transistor 62 are coupled to the collector of a transistor 64. Transistor 64 is sized the same as transistor 72, and is thus labeled 2X. Transistor 64 has two emitters which are coupled to the collector of transistor 60. The collector of transistor 64 furnishes a replicated current, $I_{in}$, to the current subtractor circuit 38. Thus, the current entering the amplifier circuit 32 differs from the magnitude of the current $I_{PTAT}$ by the magnitude of the input current $I_{in}$. A terminal 66 is also coupled to the emitters of transistor 64.

The amplifier circuit 32 comprises a terminal 68 through which the input current $I_{in}$ is input into the amplifier circuit 32. The terminal 68 is coupled to the base of a transistor 70 and to the collector of a transistor 72. The collector of transistor 70 is coupled to a terminal 74 and the emitter of transistor 70 is coupled to the base of transistor 72. The base of transistor 72 is coupled to the base of a transistor 76 and the base of transistor 64. The collector of transistor 76 is coupled to a terminal 78. The output current $I_{out}$ is generated in either the collector or the emitters of transistor 76. The emitters of transistor 76 are coupled to a terminal 80. Depending upon the configuration of the circuit 30, the load for the amplifier circuit 32 might be positioned at either terminal 78 or 80.

A resistor 82 is coupled between the base and the emitters of transistor 76. Resistor 82 provides a conduction path by which transistor 76 may be shut off. Transistor 76 is shown to be sized at ten times transistor 48. The ratio of the size of transistor 76 to the size of transistor 72 is equal to the N term in the equations discussed earlier with reference to FIG. 1. In the case of circuit 30, N would equal five.

The emitters of transistor 72 and transistor 64 are coupled to a series connection of resistors through which the current $I_{PTAT}$ flows to create the voltage $V_{PTAT}$. This series connection is shown in FIG. 2 as comprising resistors 84, 86 and 88. A terminal 90 is shown coupled to a point between resistors 84 and 86, and a terminal 92 is shown coupled to a point between resistors 86 and 88. As discussed previously, the gain of the amplification stage 32 is dependent upon the ratio of the resistance used to generate the voltage $V_{PTAT}$ to the resistance $R_s$ used to generate the current $I_{PTAT}$. Thus, by changing the value of the resistance within the amplification circuit 32, the gain of the amplification circuit 32 may be programmed to any desired value. This programming may be accomplished by shorting out selected resistors within the series connection shown in FIG. 2. For example, terminal 90 could be connected to terminal 92 to short out resistor 86 and reduce the overall resistance used to generate the $V_{PTAT}$ voltage. It should be understood that resistors 84, 86 and 88 are presented solely for the purposes of teaching the present invention. Any number of resistors and programming terminals might be included in a particular embodiment of the present invention to allow for greater flexibility in programming the gain of an amplifier stage.

Further, programmability is not limited to the value of the resistance in the amplification stage 32. The value of the resistance $R_s$ in the current source 34 is also capable of being programmed in a similar manner. These and other methods of programming the gain of an amplification stage constructed according to the present invention are intended to be included within the scope of the present invention.

Other modifications are possible to circuit 30 without departing from the scope of the present invention. For example, as discussed previously, a variety of current buffer devices may be used within an amplification circuit 32 in place of transistor 70 to provide base drive current to the transistors 72 and 76. For example, a pair of transistors configured in a Darlington fashion as shown in FIG. 3 would supply the base drive current and provide greater input resistance than the single transistor 70. In addition, there are a variety of methods of creating the voltage proportional to temperature, $V_{PTAT}$, or the current proportional to temperature, $I_{PTAT}$. The presentation of the specific embodiment illustrated in FIG. 2 is solely for purposes of teaching important technical advantages of the present invention and should not be construed to limit the scope of the present invention. For example, the NPN transistors could be changed to PNP transistors with appropriate changes in the circuit as is well known in the art.

In summary, an amplification circuit is provided which provides for a substantially constant gain over a wide range of ambient temperature conditions. According to the teaching of the present invention, a method is provided by which the gain of the amplification circuit is programmable to any one of a number of selected values. Any of the selected values of the gain is then substantially independent of ambient temperature variations.

Although the present invention has been described in detail, it should be understood that various changes, substitutions and alterations can be made hereto without departing from the spirit and scope of the invention as defined by the appended claims.

What is claimed is:

1. An amplifier circuit, comprising:
   (a) a first transistor comprising a base, an emitter and a collector;
   (b) a second transistor sized N times larger than said first transistor to determined the gain of said amplifier, where N is any predetermined factor, comprising a base, a collector and an emitter, said bases of said first and second transistors being coupled together;
   (c) a current buffer circuit coupled to said bases of said first and second transistors and operable to supply base drive current to said first and second transistors; and
   (d) circuitry for applying a voltage proportional to absolute temperature between said emitters of said first and second transistors.

2. The circuit of claim 1 wherein said current buffer circuit comprises:
   a third transistor comprising a base, an emitter and a collector, said base of said third transistor coupled to said collector of said first transistor, said emitter of said third transistor coupled to said bases of said first and second transistors and operable to supply said base drive current, said collector of said third transistor coupled to a predetermined voltage level.

3. The circuit of claim 1 wherein said current buffer circuit comprises third and fourth transistors each comprising a base, a collector and an emitter, said base of said third transistor coupled to said collector of said first transistor, said emitter of said third transistor coupled to said base of said fourth transistor, said collector of said third transistor coupled to said collector of said fourth transistor and a predetermined voltage level, said emitter of said fourth transistor coupled to said bases of said first and second transistors and operable to supply said base drive current.

4. The circuit of claim 1 wherein said circuitry for applying a voltage proportional to absolute temperature comprises:
   resistive circuitry coupled between said emitters of said first and second transistors; and
   circuitry for supplying a current proportional to absolute temperature coupled to said emitter of said first transistor and said resistive circuitry to cause current to flow through said resistive circuitry and create said voltage proportional to absolute temperature.

5. The circuit of claim 4 wherein the resistance of said resistive circuitry is programmable.

6. The circuit of claim 5 wherein said resistive circuitry comprises:
   a plurality of resistors coupled in series; and
   circuitry for shorting selected resistors of said plurality, the gain of the amplifier circuit responsive to said resistive circuitry such that the gain of the amplifier circuit is also programmable.

7. The circuit of claim 4 wherein said circuitry for supplying a current proportional to absolute temperature comprises a resistor, the value of said current proportional to temperature being inversely porportional to the value of said resistor such that the gain of the amplifier is proportional to the ratio of the value of the resistance of said resistive circuitry to the value of the resistance of said resistor.

8. The circuit of claim 1 and further comprising:
   programming circuitry for programming the gain of the amplifier circuit, said programming circuitry operable to change said voltage proportional to absolute temperature, the gain of the amplifier circuit responsive to said voltage proportional to absolute temperature.

9. The circuit of claim 1 wherein said second transistor is formed such that its size is proportionately larger than the first transistor, the gain of the amplifier being proportional to the ratio of the size of the second transistor to the size of the first transistor.

10. The circuit of claim 1 wherein said transistor comprise npn bipolar junction transistors.

11. The circuit of claim 1 wherein said transistors comprise pnp bipolar junction transistors.

12. An amplifier circuit having a programmable gain, comprising:
    (a) a first transistor comprising a base, a collector and an emitter, said first transistor operable to receive an input current input into the amplifier circuit;
    (b) a second transistor comprising a base, a collector and an emitter, said bases of said first and second transistors coupled together, said second transistor sized relative to said first transistor to have a predetermined greater size and operable to generate an output current for the amplifier circuit;
    (c) a third transistor comprising a base, a collector and an emitter, said emitter of said third transistor coupled to said bases of said first and second transistors, said base of said third transistor coupled to said collector of said first transistor, said third transistor operable to supply base drive current to said first and second transistors;
    (d) programmable resistive element having a plurality of predetermined resistance levels coupled between said emitters of said first and second transistors; and
    (e) circuitry for supplying a current proportional to absolute temperate to create a voltage between said emitters of said first and second transistors across said programmable resistive element.

13. The circuit of claim 12 wherein said transistors comprise npn bipolar junction transistors.

14. The circuit of claim 12 wherein said transistors comprise pnp bipolar junction transistors.

15. An amplifier circuit having a programmable gain, comprising:
    (a) a first transistor comprising a base, a collector and an emitter, said first transistor operable to receive an input current input into the amplifier circuit;
    (b) a second transistor comprising a base, a collector and an emitter, said bases of said first and second transistors coupled together, said second transistor sized proportionately to said first transistor and operable to generate an output current for the amplifier circuit;
    (c) a third transistor comprising a base, a collector and an emitter, said emitter of said third transistor coupled to said bases of said first and second transistors, said base of said third transistor coupled to said collector of said first transistor, said third transistor operable to supply base drive current to said first and second transistors;
    (d) a programmable resistive element having a plurality of predetermined resistance levels coupled between said emitters of said first and second transistors; and (e) circuitry for supplying a current proportional to absolute temperature to create a voltage between said emitters of said first and second transistors across said programmable resistive element;

(f) said circuitry to supply a current comprising a resistor, said output current amplified relative to said input current by a gain factor, said gain factor being substantially constant with respect to absolute temperature changes and proportional to the ratio of the size of said second transistor to said first transistor and proportional to the ratio of the value of the resistance of said resistive element to the value of the resistance of said resistor.

16. An amplifier circuit having a programmable gain, comprising:

(a) a first transistor comprising a base, collector and an emitter, said first transistor operable to receive an input current input into the amplifier circuit;

(b) a second transistor comprising a base, a collector and an emitter, said bases of said first and second transistors coupled together, said second transistor sized proportionately to said first transistor and operable to generate an output current for the amplifier circuit;

(c) a third transistor comprising a base, a collector and an emitter, said emitter of said third transistor coupled to said bases of said first and second transistor, said base of said third transistor coupled to said collector of said first transistor, said third transistor operable to supply base drive current to said first and second transistors;

(d) a programmable resistive element having a plurality of predetermined resistance levels coupled between said emitters of said first and second transistors; and (e) circuitry for supplying a current proportional to absolute temperature to create a voltage between said emitters of said first and second transistors across said programmable resistive element;

(f) wherein said programmable resistive element comprises:

a plurality of resistors of predetermined values coupled in series; and circuitry for shorting out selected resistors of said plurality in order to program the overall resistance value of said resistive element.

17. A method for amplifying a current signal comprising the steps of:

(a) supplying an input current to a collector of a first transistor;

(b) generating an output current through the collector of a second transistor responsive to said input current;

(c) supplying a voltage proportional to absolute temperature between an emitter of the first transistor and an emitter of the second transistor; and (d) supplying base drive current to the bases of the first and second transistors;

(e) wherein the resistive element comprises a plurality of resistors coupled in series, the method further comprising the step of:

(f) shorting out selected resistors in the resistive element in order to adjust the voltage proportional to temperature, the output current substantially proportional to the input current by a gain factor, the gain factor responsive to the level of the voltage proportional to absolute temperature.

18. The method for constructing a current amplifier circuit comprising the steps of:

(a) forming a first transistor comprising a base, an emitter and a collector;

(b) forming a second transistor comprising a base, a collector and an emitter, said second transistor sized relative to said first transistor to have a predetermined greater size, said bases of said first and second transistors being coupled together;

(c) forming a current buffer circuit coupled to said bases of said first and second transistors and operable to supply base drive current to said first and second transistors; and (d) forming circuitry for applying a voltage proportional to absolute temperature between said emitters of said first and second transistors.

19. The method of claim 18 wherein said step of forming a current buffer circuit comprises the step of:

forming a third transistor comprising a base, an emitter and a collector, the base of the third transistor coupled to the collector of the first transistor, the emitter of the third transistor coupled to the bases of the first and second transistors and operable to supply the base drive current, the collector of the third transistor coupled to a predetermined voltage level.

20. The method of claim 18 wherein said step of forming a current buffer circuit comprises the step of:

forming third and fourth transistors each comprising a base, a collector and an emitter, the base of the third transistor coupled to the collector of the first transistor, the emitter of the third transistor coupled to the base of the fourth transistor, the collector of the third transistor coupled to the collector of the fourth transistor and a predetermined voltage level, the emitter of the fourth transistor coupled to the bases of the first and second transistors and operable to supply the base drive current.

21. The method of claim 18 wherein said step of forming circuitry for applying a voltage proportional to absolute temperature comprises the steps of:

forming resistive circuitry coupled between said emitter of said first and second transistors; and forming circuitry for supplying a current proportional to absolute temperature coupled to said emitter of said first transistor and said resistive circuitry to cause current to flow through said resistive circuitry, such that the current flowing through said resistive circuitry creates said voltage proportional to absolute temperature.

22. The method for constructing a current amplifier circuit comprising the steps of:

(a) forming a first transistor comprising a base, an emitter and a collector;

(b) forming a second transistor comprising a base, a collector and an emitter, said bases of said first and second transistors being coupled together;

(c) forming a current buffer circuit coupled to said bases of said first and second transistors and operable to supply base drive current to said first and second transistors; and (d) forming circuitry for applying a voltage proportional to absolute temperature between said emitters of said first and second transistors.

(e) wherein said step of forming circuitry for applying a voltage porportional to absolute temperature comprises the steps of:

(f) forming resistive circuitry coupled between said emitters of said first and second transistors; and (g) forming circuitry for supplying a current proportional to absolute temperature coupled to said emitter of said first transistor and said resistive circuitry to cause current to flow through said resistive circuitry, such that the current flowing through the resistive circuitry creates said voltage proportional to absolute temperature;

(h) wherein said step of forming resistive circuitry comprises the steps of:

(i) forming a plurality of resistors coupled in series; and forming circuitry for shorting selected resistors of the plurality, the gain of the amplifier circuit responsive to the resistive circuitry such that the gain of the amplifier circuit is also programmable.

23. The method for constructing a current amplifier circuit comprising the steps of:

(a) forming a first transistor comprising a base, an emitter and a collector;

(b) forming a second transistor comprising a base, a collector and an emitter, said bases of said first and second transistors being coupling together;

(c) forming a current buffer circuit coupled to said bases of said first and second transistors and operable to supply base drive current to said first and second transistors; and (d) forming circuitry for applying a voltage proportional to absolute temperature between said emitters of said first and second transistors;

(e) wherein said step of forming circuitry for applying a voltage proportional to absolute temperature comprises the steps of:

(f) forming resistive circuitry coupled between said emitters of said first and second transistors; and (g) forming circuitry for supplying a current proportional to absolute temperature coupled to said emitter of said first transistor and said resistive circuitry to cause current to flow through said resistive circuitry, such that the current flowing through the resistive circuitry creates said voltage proportional to absolute temperature;

(h) wherein the step of forming circuitry for supplying a current proportional to absolute temperature comprises the step of forming a resistor, the value of the current porportional to absolute temperature inversely proportional to the value of the resistor such that the gain of the amplifier is proportional to the ration of the value of the resistance of the resistive circuitry to the value of the resistance of the resistor.

* * * * *